(12) United States Patent
Lou

(10) Patent No.: US 6,440,847 B1
(45) Date of Patent: Aug. 27, 2002

(54) METHOD FOR FORMING A VIA AND INTERCONNECT IN DUAL DAMASCENE

(75) Inventor: Chine-Gie Lou, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/845,479

(22) Filed: Apr. 30, 2001

(51) Int. Cl.$^7$ .......................................... H01L 21/4763
(52) U.S. Cl. ........................................ 438/639; 438/758
(58) Field of Search .................. 438/637, 639, 438/672, 675, 722, 723, 724, 725, 743, 744, 756, 757, 311, 780, 758, 782

(56) References Cited

U.S. PATENT DOCUMENTS

| 5,686,354 | A |   | 11/1997 | Avanzino et al. | ............ | 437/190 |
| 5,741,626 | A |   | 4/1998  | Jain et al.     | ............ | 430/314 |
| 5,792,687 | A |   | 8/1998  | Jeng et al.     | ............ | 438/253 |
| 5,795,823 | A |   | 8/1998  | Avanzino et al. | ............ | 438/639 |
| 5,858,829 | A |   | 1/1999  | Chen            | ............ | 438/238 |
| 5,916,823 | A | * | 6/1999  | Lou et al.      | ............ | 438/738 |
| 6,071,812 | A |   | 6/2000  | Hsu et al.      | ............ | 438/668 |
| 6,150,723 | A |   | 11/2000 | Harper et al.   | ............ | 257/762 |
| 6,187,661 | B1| * | 2/2001  | Lou             | ............ | 438/622 |
| 6,211,061 | B1| * | 4/2001  | Chen et al.     | ............ | 438/622 |
| 6,225,204 | B1| * | 5/2001  | Wu et al.       | ............ | 438/597 |
| 6,265,321 | B1| * | 7/2001  | Chooi et al.    | ............ | 438/725 |
| 6,309,962 | B1| * | 10/2001 | Chen et al.     | ............ | 438/638 |

* cited by examiner

*Primary Examiner*—David Nelms
*Assistant Examiner*—David Nhu
(74) *Attorney, Agent, or Firm*—George O. Saile; Stephen B. Ackerman; Stephen G. Stanton

(57) ABSTRACT

A first low-k layer is formed over a structure having an exposed active device. A patterned first nitride layer having an opening therethrough aligned over a portion of the active device is formed. Nitride spacers are formed over the side walls of the opening. A second low-k layer is formed over the patterned first nitride layer, filling the patterned first nitride layer opening. The second low-k layer and the first low-k layer through the opening reduced by the nitride spacers are patterned to expose a portion of the active device to form a preliminary dual damascene. The nitride spacers and the first nitride layer exposed by the preliminary dual damascene opening are removed to form a final upper horizontal interconnect opening having substantially 90° edges. The first and second low-k layers are then reflowed to round the substantially 90° edges of the first and second low-k layer.

36 Claims, 4 Drawing Sheets

METHOD FOR FORMING A VIA AND INTERCONNECT IN DUAL DAMASCENE

BACKGROUND OF THE INVENTION

With the continuing shrinkage of integrated circuit (IC) feature sizes, it is becoming more and more difficult to define small via patterns.

U.S. Pat. No. 6,071,812 to Hsu et al. describes a method of fabricating a metal contact in a reduced aspect ratio contact hole. A spacer is formed on the sidewall of a dielectric layer to etch a small trench opening in a dual damascene process.

U.S. Pat. Nos. 6,150,723 to Harper et al., 5,916,823 to Lou et al., 5,686,354 and 5,795,823 both to Avanzino et al., and 5,741,626 to Jain et al. each describe related dual damascene processes.

U.S. Pat. Nos. 5,858,829 to Chen and 5,792,687 to Jeng et al. each describe the use of spacers to form small openings.

SUMMARY OF THE INVENTION

Accordingly, it is an object of the present invention to provide a method of forming a via and interconnect in a corner rounded dual damascene structure.

Another object of the present invention is to provide a method of forming a via and interconnect in a dual damascene structure that reduces the RC time delay.

A further object of the present invention is to provide a method of forming a via and interconnect in a dual damascene structure that eliminates the metal open issue.

Yet another object of the present invention is to provide a method of forming a via and interconnect in a dual damascene structure that resolves the photo issue for defining small patterns.

Other objects will appear hereinafter.

It has now been discovered that the above and other objects of the present invention may be accomplished in the following manner. Specifically, a structure having an exposed active device is provided. A first low-k layer is formed over the structure and active device. A patterned first nitride layer is formed having an opening exposing a portion of first low-k layer aligned over at least a portion of the active device. The patterned first nitride layer having exposed side walls within opening. A second nitride layer is formed over the first nitride layer, lining opening. The second nitride layer is removed, leaving nitride spacers over the side walls of patterned first nitride layer. A second low-k layer is formed over the patterned first nitride layer, filling the patterned first nitride layer opening adjacent the nitride spacers. The second low-k layer, and the first low-k layer through the opening reduced by the nitride spacers are patterned to expose a portion of the active device centered under the portion of first low-k layer exposed by the patterned first nitride layer to form a preliminary dual damascene opening having a lower vertical via opening and a preliminary upper horizontal interconnect opening. The nitride spacers and the first nitride layer exposed by the preliminary dual damascene opening are removed to form a final upper horizontal interconnect opening. The dual damascene opening having substantially 90° edges of the first and second low-k layer. The first and second low-k layers are reflowed to round the substantially 90° edges of the first and second low-k layer within the final dual damascene opening.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
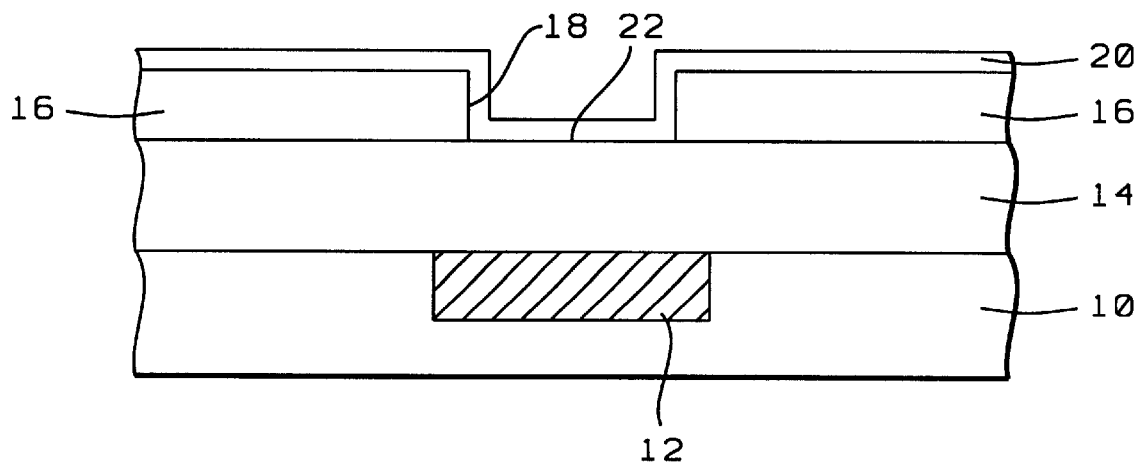
FIG. 1 to 7 are schematically illustrate a preferred embodiment of the present invention.

As shown in FIG. 1, starting semiconductor structure 10 includes at least one exposed active device 12, such as a metal line. Semiconductor structure 10 is also understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Active device 12 may be a metal line preferably comprised of copper or aluminum.

First low-k material layer 14 is formed over semiconductor structure 10, preferably by a spin-on process. First low-k layer 14 is preferably comprised of FLARE or polymer and is more preferably FLARE. First low-k layer 14 is preferably from about 1000 to 8000 Å thick and is more preferably from about 2500 to 6000 Å thick.

First nitride, BN or silicon nitride ($Si_3N_4$ or SiN) layer 16 is formed over first low-k layer 14 to a thickness of preferably from about 50 to 1000 Å and more preferably from about 300 to 600 Å. First nitride layer 16 is then patterned to form opening 18 exposing a portion 22 of first low-k layer 14 that is aligned over at least a portion of active device 12. Layer 16 is more preferably comprised of SiN.

Opening 18 is preferably from about 1000 to 5000 Å wide and more preferably from about 1500 to 4000 Å wide.

Second nitride, BN or SiN layer 20 is then formed over first nitride layer 16, lining opening 18 and covering exposed portion 22 of first low-k layer 14, to a thickness of preferably from about 50 to 2000 Å and more preferably from about 150 to 1000 Å. Layer 20 is more preferably comprised of SiN.

Formation of Nitride Spacers 24

Figure 2:
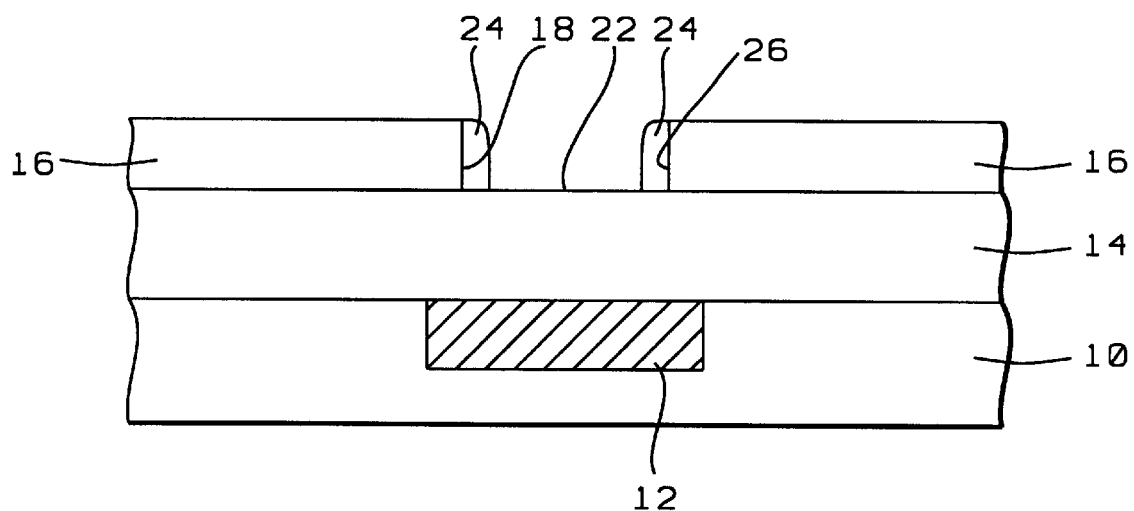

In a key step of the invention as shown in FIG. 2, second nitride layer 20 is etched to form nitride spacers 24 on the side walls 26 of first nitride layer 16 within opening 18. As noted above, nitride spacers 24 may also be comprised of silicon nitride or BN and are preferably comprised of SiN.

SiN spacers 24 are preferably from about 50 to 2000 Å wide and more preferably from about 150 to 1000 Å wide. This permits formation of a narrower via opening 36 (see below) than otherwise possible.

Formation of Second Low-K Layer 28 and Overlying Patterned Mask Layer 30

Figure 3:
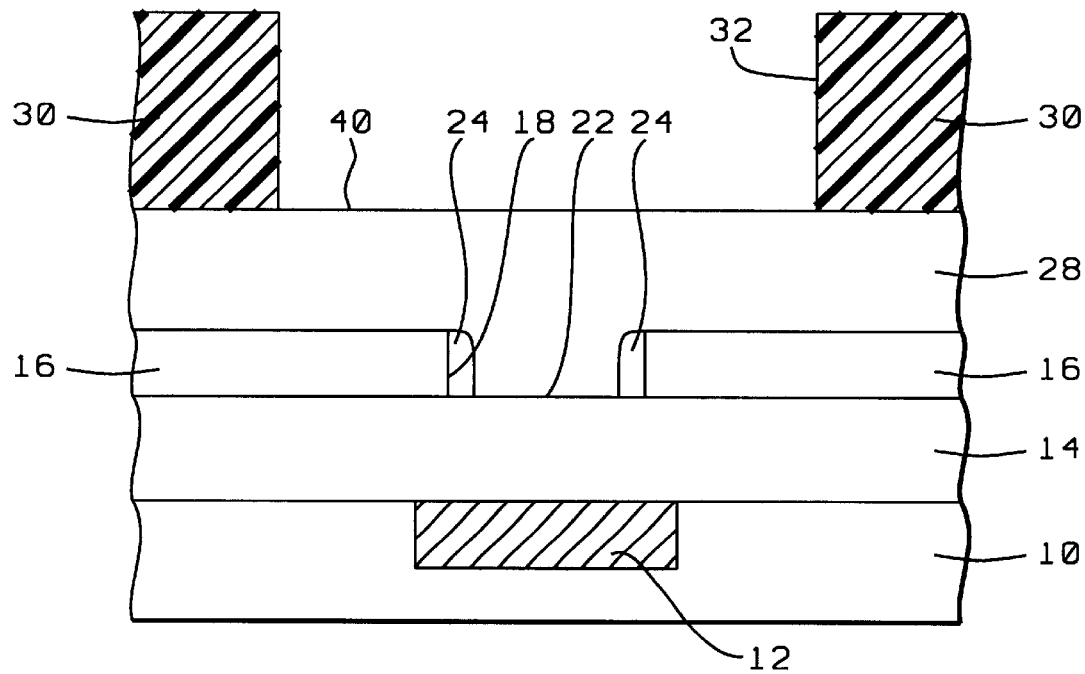

As shown in FIG. 3, second low-k material layer 28 is formed over the structure of FIG. 2, covering first patterned SiN layer 16, SiN spacers 24, exposed portion 22 of first low-k layer 14 and filling opening 18 between SiN spacers 24. Second low-k layer 28 is preferably formed by a spin-on-coating process.

Second low-k layer 28 is preferably comprised of FLARE or polymer and is more preferably FLARE. Second low-k layer 28 is preferably from about 2000 to 8000 Å thick and is more preferably from about 3000 to 6000 Å thick.

Second low-k layer 28 is patterned to form opening 32 exposing a portion 40 of second low-k layer 28 substantially centered over first SiN layer 16 opening 18. Second low-k layer 28 may be patterned by, for example, forming patterned mask layer 30 over second low-k layer 28. Mask layer 30, if used, is preferably comprised of photoresist material.

Etching of Second and First Low-K Layers 28, 14

Figure 4:
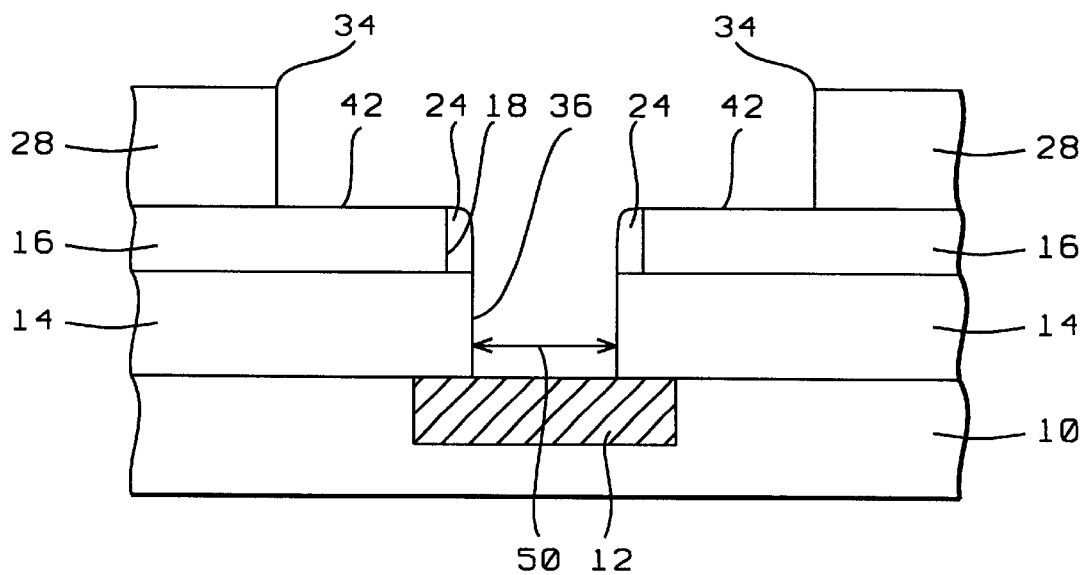

As shown in FIG. 4, preferably using a reactive ion etch (RIE),:

(1) patterned mask layer 30 is used as an etch mask and first SiN layer 16 and SiN spacers 24 as an etch stop layer, second low-k layer 28 beneath exposed portion 40 is substantially vertically etched down to first SiN layer 16 (exposing portions 42 of first SiN layer 16) and SiN spacers 24 and through opening 18 between SiN spacers 24; and (2) using first SiN layer 16 and SiN spacers 24 as an etch mask, first low-k layer 14 beneath exposed portion 22 is substantially vertically etched down to active device 12 to form via opening 36.

Etched upper low-k layer 28 has sharp upper corners 34

It is noted that use of SiN spacers 24 permits a more narrow via opening 36 that would otherwise be possible using just opening 18 in etched first SiN layer 16. Via opening 36 has a width 50 of preferably from about 1000 to 5000 Å, and more preferably from about 1000 to 3000 Å.

Mask layer 30 is then removed, preferably by stripping, from over etched second low-k layer 28.

Etching Nitride Spacers 24 and Exposed Portions 42 of First Nitride Layer 16 to Complete Horizontal Interconnect 54

Figure 5:
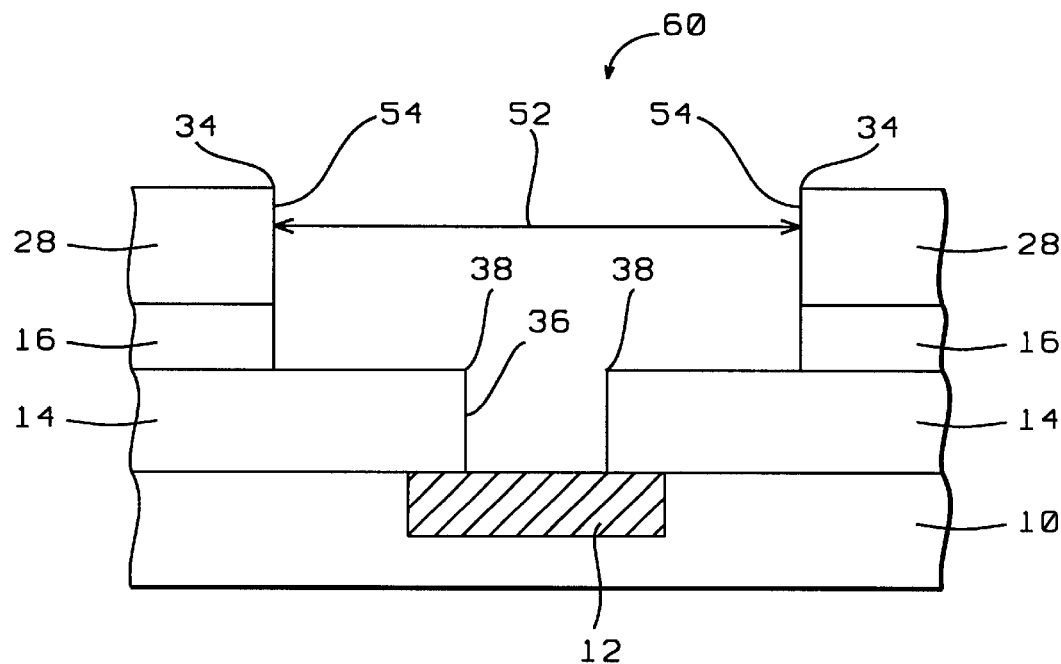

As shown in FIG. 5, SiN spacers 24 and exposed portions 42 of first SiN layer 16 are removed, preferably by a reactive ion etch (RIE) to complete formation of the upper horizontal interconnect 54. High etch selectively protects second low-k layer 28 from the nitride spacer etch. Upper horizontal interconnect opening 54 and lower, vertical narrow via opening 36 together form dual damascene opening 60.

With SiN spacer removed from over etched first low-k layer 14, sharp corners 38 are exposed leading into via opening 36.

Removal of exposed portions 42 of first SiN layer 16 minimizes the problem with RC time delay otherwise present.

Low-K 28,14 Reflow

Figure 6:
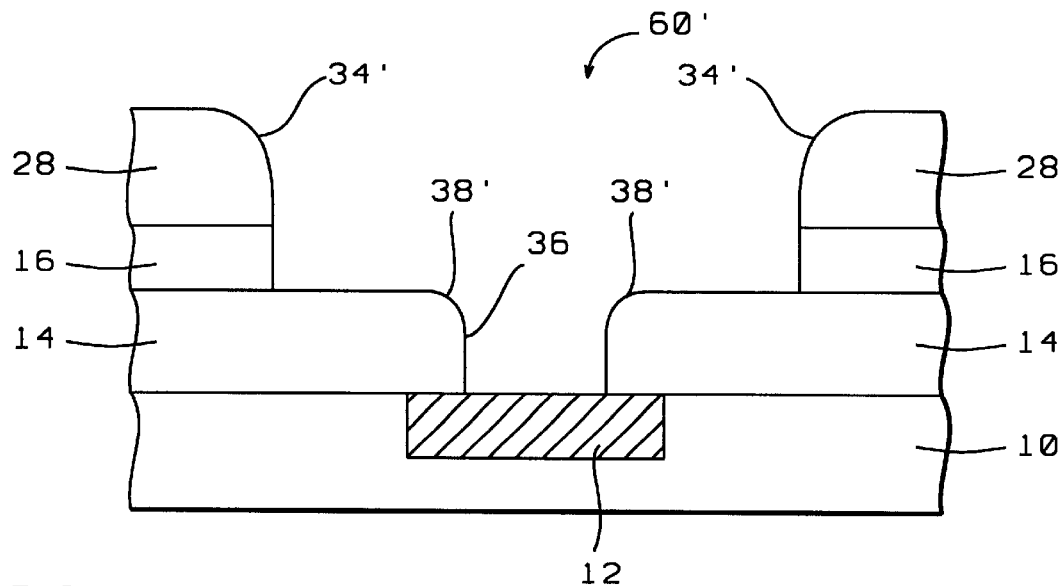

In another key step of the invention, as shown in FIG. 6, a reflow of the low-k material of layers 38, 14 causes low-k layer 28 sharp corners 34 and low-k layer 14 sharp corners 38 to become rounded as rounded corners 38', 34', respectively. The low-k reflow is conducted for preferably from about 5 to 20 seconds and more preferably from about 8 to 17 seconds at a temperature of from about 400 to 435° C. and more preferably from about 415 to 425° C.

This forms rounded corner dual damascene opening 60'.

Completion of Dual Damascene Structure 70

Figure 7:
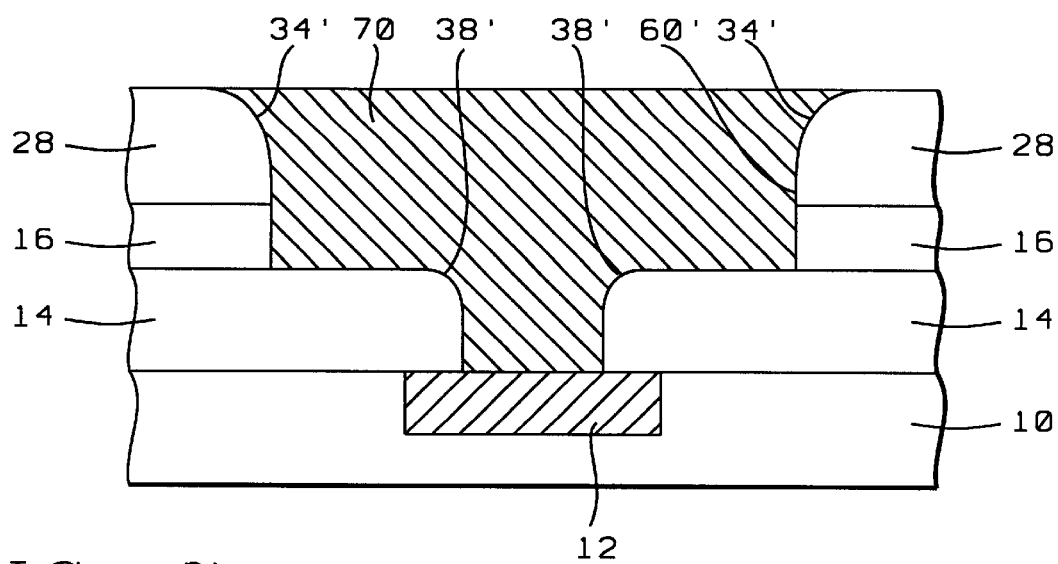

As shown in FIG. 7, a metal layer is formed over the structure, filling rounded corner dual damascene opening 60', and is then planarized to remove the excess of the metal layer over etched low-k layer 28 to form planarized dual damascene metal structure 70 within rounded corner dual damascene opening 60'.

Dual damascene metal structure 70 is preferably comprised of copper or aluminum and is more preferably copper.

Advantages of the Present Invention

The advantages of the present invention include:

1. a smaller via opening 36 critical dimension (CD) is permitted;
2. a corner rounded dual damascene structure 40 is formed;
3. the RC time delay is reduced in the dual damascene structure 40 so formed;
4. the metal open issue (i.e. having a non-continuous metal line) is eliminated in the dual damascene structure so formed; and
5. the photo issue for defining small patterns is resolved by the method of the present invention.

While particular embodiments of the present invention have been illustrated and described, it is not intended to limit the invention, except as defined by the following claims.

I claim:

1. A method of forming a dual damascene opening, comprising the steps of:

providing a structure having an exposed active device;

forming a first low-k layer over the structure and active device;

forming a patterned first nitride layer having an opening exposing a portion of first low-k layer aligned over at least a portion of the active device; the patterned first nitride layer having exposed side walls within opening;

forming a second nitride layer over the first nitride layer, lining opening;

removing the second nitride layer, leaving nitride spacers over the side walls of patterned first SiN layer;

forming a second low-k layer over the patterned first nitride layer, filling the patterned first nitride layer opening adjacent the SiN spacers;

patterning the second low-k layer, and the first low-k layer through the opening reduced by the nitride spacers to expose a portion of the active device centered under the portion of first low-k layer exposed by the patterned first nitride layer to form a preliminary dual damascene opening having a lower vertical via opening and a preliminary upper horizontal interconnect opening;

removing the nitride spacers and the first nitride layer exposed by the preliminary dual damascene opening to form a final upper horizontal interconnect opening; the dual damascene opening having substantially 90° edges of the first and second low-k layer; and reflowing the first and second low-k layers to round the substantially 90° edges of the first and second low-k layer within the final dual damascene opening.

2. The method of claim 1, wherein the first low-k layer is comprised of a material selected from the group consisting of FLARE and polymer; and the second low-k layer is comprised of a material selected from the group consisting of FLARE and polymer.

3. The method of claim 1, wherein the first and second low-k layers are each comprised of FLARE.

4. The method of claim 1, wherein the first low-k layer is formed by a spin-on method; and the second low-k layer is formed by a spin-on method.

5. The method of claim 1, wherein the first low-k layer has a thickness of from about 1000 to 8000 Å; the first nitride layer has a thickness of from about 50 to 1000 Å; the second nitride layer has a thickness of from about 50 to 2000 Å; the nitride spacers each have a width of from about 50 to 2000 Å; and the second low-k layer has a thickness of from about 2000 to 8000 Å.

6. The method of claim 1, wherein the first low-k layer has a thickness of from about 2500 to 6000 Å; the first nitride layer has a thickness of from about 300 to 600 Å; the second nitride layer has a thickness of from about 150 to 1000 Å; the nitride spacers each have a width of from about 150 to 1000 Å; and the second low-k layer has a thickness of from about 3000 to 6000 Å.

7. A method of forming a dual damascene opening, comprising the steps of:

providing a structure hating an exposed active device;

forming a first low-k layer over the structure and active device;

forming a patterned first nitride layer having an opening exposing a portion of first low-k layer aligned over at least a portion of the active device; the patterned first nitride layer having exposed side walls within opening;

forming a second nitride layer over the first nitride layer, lining opening;

removing the second nitride layer, leaving nitride spacers over the side walls of patterned first SiN layer;

forming a second low-k layer over the patterned first nitride layer, filling the patterned first nitride layer opening adjacent the SiN spacers;

patterning the second low-k layer, and the first low-k layer through the opening reduced by the nitride spacers to expose a portion of the active device centered under the portion of first low-k layer exposed by the patterned first nitride layer to form a preliminary dual damascene opening having a lower vertical via opening and a preliminary upper horizontal interconnect opening;

removing the nitride spacers and the first nitride layer exposed by the preliminary dual damascene opening to form a final upper horizontal interconnect opening; the dual damascene opening having substantially 90° edges of the first and second low-k layer;

reflowing the first and second low-k layers to round the substantially 90° edges of the first and second low-k layer within the final dual damascene opening;

forming a metal layer over the second patterned low-k layer and filling the rounded edge final dual damascene opening; and planarizing the metal layer to remove the excess metal from the second low-k layer and forming a planarized metal dual damascene structure.

8. The method of claim 1, wherein the reflowing of the first and second low-k layers is conducted at a temperature of from about 400 to 435° C. for from about 5 to 20 seconds.

9. The method of claim 1, wherein the reflowing of the first and second low-k layers is conducted at a temperature of from about 415 to 425° C. for from about 8 to 17 seconds.

10. A method of forming a dual damascene opening, comprising the steps of:

providing a structure having an exposed active device;

forming a first low-k layer over the structure and active device; the first low-k layer being comprised of a material selected from the group consisting of FLARE and polymer;

forming a patterned first nitride layer having an opening exposing a portion of first low-k layer aligned over at least a portion of the active device; the patterned first nitride layer having exposed side walls within opening;

forming a second nitride layer over the first nitride layer, lining opening;

removing the second nitride layer, leaving nitride spacers over the side walls of patterned first nitride layer;

forming a second low-k layer over the patterned first nitride layer, filling the patterned first nitride layer opening adjacent the nitride spacers; the second low-k layer being comprised of a material selected from the group consisting of FLARE and polymer;

patterning the second low-k layer, and the first low-k layer through the opening reduced by the nitride spacers to expose a portion of the active device centered under the portion of first low-k layer exposed by the patterned first nitride layer to form a dual damascene opening having a lower vertical via opening and a preliminary upper horizontal interconnect opening;

removing the nitride spacers and the first nitride layer exposed by the first dual damascene opening to form a final upper horizontal interconnect opening; the dual damascene opening having substantially 90° edges of the first and second low-k layer; and reflowing the first and second low-k layers to round the substantially 90° edges of the first and second low-k layer within the second dual damascene opening.

11. The method of claim 10, wherein the first and second low-k layers are each comprised of FLARE.

12. The method of claim 10, wherein the first low-k layer is formed by a spin-on method; and the second low-k layer is formed by a spin-on method.

13. The method of claim 10, wherein the first low-k layer has a thickness of from about 1000 to 8000 Å; the first nitride layer has a thickness of from about 50 to 1000 Å; the second nitride layer has a thickness of from about 50 to 2000 Å; the nitride spacers each have a width of from about 50 to 2000 Å; and the second low-k layer has a thickness of from about 2000 to 8000 Å.

14. The method of claim 10, wherein the first low-k layer has a thickness of from about 2500 to 6000 Å; the first nitride layer has a thickness of from about 300 to 600 Å; the second nitride layer has a thickness of from about 150 to 1000 Å; the nitride spacers each have a width of from about 150 to 1000 Å; and the second low-k layer has a thickness of from about 3000 to 6000 Å.

15. The method of claim 10, wherein the reflowing of the first and second low-k layers is conducted at a temperature of from about 400 to 435° C. for from about 5 to 20 seconds.

16. The method of claim 10, wherein the reflowing of the first and second low-k layers is conducted at a temperature of from about 415 to 425° C. for from about 8 to 17 seconds.

17. A method of forming a dual damascene opening, comprising the steps of:

providing a structure having an exposed active device;

forming a first low-k layer over the structure and active device; the first low-k layer being comprised of a material selected from the group consisting FLARE and polymer; the first low-k layer being formed by a spin-on method;

forming a patterned first nitride layer having an opening exposing a portion of first low-k layer aligned over at least a portion of the active device; the patterned first nitride layer having exposed side walls within opening;

forming a second nitride layer over the first nitride layer, lining opening;

removing the second nitride layer, leaving nitride spacers over the side walls of patterned first nitride layer;

forming a second low-k layer over the patterned first nitride layer, filling the patterned first nitride layer opening adjacent the nitride spacers; the second low-k layer being comprised of a material selected from the group consisting of FLARE and polymer; the second low-k layer being formed by a spin-on method;

patterning the second low-k layer, and the first low-k layer through the opening reduced by the nitride spacers to expose a portion of the active device centered under the portion of first low-k layer exposed by the patterned first nitride layer to form a dual damascene opening having a lower vertical via opening and a preliminary upper horizontal interconnect opening;

removing the nitride spacers and the first nitride layer exposed by the first dual damascene opening to form a final upper horizontal interconnect opening; the dual damascene opening having substantially 90° edges of the first and second low-k layer; and reflowing the first and second low-k layers to round the substantially 90° edges of the first and second low-k layer within the second dual damascene opening.

18. The method of claim 17, wherein the first and second low-k layers are each comprised of FLARE.

19. The method of claim 17, wherein the first low-k layer has a thickness of from about 1000 to 8000 Å; the first nitride layer has a thickness of from about 50 to 1000 Å; the second nitride layer has a thickness of from about 50 to 2000 Å; the nitride spacers each have a width of from about 50 to 2000 Å; and the second low-k layer has a thickness of from about 2000 to 8000 Å.

20. The method of claim 17, wherein the first low-k layer has a thickness of from about 2500 to 6000 Å; the first nitride layer has a thickness of from about 300 to 600 Å; the second nitride layer has a thickness of from about 150 to 1000 Å; the nitride spacers each have a width of from about 150 to 1000 Å; and the second low-k layer has a thickness of from about 3000 to 6000 Å.

21. The method of claim 17, wherein the reflowing of the first and second low-k layers is conducted at a temperature of from about 400 to 435° C. for from about 5 to 20 seconds.

22. The method of claim 17, wherein the reflowing of the first and second low-k layers is conducted at a temperature of from about 415 to 425° C. for from about 8 to 17 seconds.

23. A method of forming a dual damascene opening, comprising the steps of:

providing a structure having an exposed active device;

forming a first low-k FLARE layer over the structure and active device;

forming a patterned first nitride layer having an opening exposing a portion of first low-k FLARE layer aligned over at least a portion of the active device; the patterned first nitride layer having exposed side walls within opening;

forming a second nitride layer over the first nitride layer, lining opening;

removing the second nitride layer, leaving nitride spacers over the side walls of patterned first SiN layer;

forming a second low-k FLARE layer over the patterned first nitride layer, filling the patterned first nitride layer opening adjacent the SiN spacers;

patterning the second low-k FLARE layer, and the first low-k FLARE layer through the opening reduced by the nitride spacers to expose a portion of the active device centered under the portion of first low-k FLARE layer exposed by the patterned first nitride layer to form a preliminary dual damascene opening having a lower vertical via opening and a preliminary upper horizontal interconnect opening;

removing the nitride spacers and the first nitride layer exposed by the preliminary dual damascene opening to form a final upper horizontal interconnect opening; the dual damascene opening having substantially 90° edges of the first and second low-k FLARE layers; and reflowing the first and second low-k layers to round the substantially 90° edges of the first and second low-k FLARE layers within the final dual damascene opening.

24. The method of claim 23, wherein the first low-k FLARE layer is formed by a spin-on method; and the second low-k FLARE layer is formed by a spin-on method.

25. The method of claim 23, wherein the first low-k FLARE layer has a thickness of from about 1000 to 8000 Å; the first nitride layer has a thickness of from about 50 to 1000 Å; the second nitride layer has a thickness of from about 50 to 2000 Å; the nitride spacers each have a width of from about 50 to 2000 Å; and the second low-k FLARE layer has a thickness of from about 2000 to 8000 Å.

26. The method of claim 23, wherein the first low-k FLARE layer has a thickness of from about 2500 to 6000 Å; the first nitride layer has a thickness of from about 300 to 600 Å; the second nitride layer has a thickness of from about 150 to 1000 Å; the nitride spacers each have a width of from about 150 to 1000 Å; and the second low-k FLARE layer has a thickness of from about 3000 to 6000 Å.

27. The method of claim 23, including the steps of:

forming a metal layer over the second patterned low-k FLARE layer and filling the rounded edge final dual damascene opening; and planarizing the metal layer to remove the excess metal from the second low-k FLARE layer and forming a planarized metal dual damascene structure.

28. The method of claim 23, wherein the reflowing of the first and second low-k FLARE layers is conducted at a temperature of from about 400 to 435° C. for from about 5 to 20 seconds.

29. The method of claim 23, wherein the reflowing of the first and second low-k FLARE layers is conducted at a temperature of from about 415 to 425° C. for from about 8 to 17 seconds.

30. The method of claim 7, wherein the first low-k layer is comprised of a material selected from the group consisting of FLARE and polymer; and the second low-k layer is comprised of a material selected from the group consisting of FLARE and polymer.

31. The method of claim 7, wherein the first and second low-k layers are each comprised of FLARE.

32. The method of claim 7, wherein the first low-k layer is formed by a spin-on method; and the second low-k layer is formed by a spin-on method.

33. The method of claim 7, wherein the first low-k layer has a thickness of from about 1000 to 8000 Å; the first nitride layer has a thickness of from about 50 to 1000 Å; the second nitride layer has a thickness of from about 50 to 2000 Å; the nitride spacers each have a width of from about 50 to 2000 Å; and the second low-k layer has a thickness of from about 2000 to 8000 Å.

34. The method of claim 7, wherein the first low-k layer has a thickness of from about 2500 to 6000 Å; the first nitride layer has a thickness of from about 300 to 600 Å; the second nitride layer has a thickness of from about 150 to 1000 Å; the nitride spacers each have a width of from about 150 to 1000 Å; and the second low-k layer has a thickness of from about 3000 to 6000 Å.

35. The method of claim 7, wherein the reflowing of the first and second low-k layers is conducted at a temperature of from about 400 to 435° C. for from about 5 to 20 seconds.

36. The method of claim 7, wherein the reflowing of the first and second low-k layers is conducted at a temperature of from about 415 to 425° C. for from about 8 to 17 seconds.

* * * * *